US011287345B2

(12) United States Patent
Burssens

(10) Patent No.: US 11,287,345 B2
(45) Date of Patent: Mar. 29, 2022

(54) SENSOR INCLUDING OXYGEN GETTER METALLIC MATERIAL FOR IMPROVED PROTECTION

(71) Applicant: Melexis Technologies NV, Tessenderlo (BE)

(72) Inventor: Jan-Willem Burssens, Tielt-Winge (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 336 days.

(21) Appl. No.: 16/440,440

(22) Filed: Jun. 13, 2019

(65) Prior Publication Data
US 2019/0383687 A1 Dec. 19, 2019

(30) Foreign Application Priority Data
Jun. 15, 2018 (EP) .................................. 18178089

(51) Int. Cl.
*G01L 19/00* (2006.01)
*G01L 19/06* (2006.01)
*C23C 14/16* (2006.01)

(52) U.S. Cl.
CPC .......... *G01L 19/0627* (2013.01); *C23C 14/16* (2013.01); *G01L 19/0092* (2013.01); *G01L 2019/0053* (2013.01)

(58) Field of Classification Search
None
See application file for complete search history.

(56) References Cited

U.S. PATENT DOCUMENTS

| 5,348,894 A | | 9/1994 | Gnade et al. |
| 6,215,650 B1 | * | 4/2001 | Gnade ............... H01L 21/32051 257/306 |
| 6,225,656 B1 | * | 5/2001 | Cuchiaro .......... H01L 27/11502 257/295 |
| 9,796,579 B2 | * | 10/2017 | Takagi ................ B81C 1/00325 |

(Continued)

FOREIGN PATENT DOCUMENTS

| CN | 1337003 A | 2/2002 |
| CN | 102104042 A | 6/2011 |

(Continued)

OTHER PUBLICATIONS

Extended European Search Report for EP Application No. 18178089.1, dated Nov. 23, 2018.

(Continued)

*Primary Examiner* — Lisa M Caputo
*Assistant Examiner* — Nigel H Plumb
(74) *Attorney, Agent, or Firm* — Workman Nydegger

(57) ABSTRACT

The invention relates to sensors comprising a substrate, a platinum component having a first surface facing toward the substrate and a second surface facing away from the substrate, a protective covering over the platinum component, the protective covering comprising one or more layers, at least on of which is an oxygen getter material, a lower surface in physical contact with the second surface of the platinum component, and an upper surface; and a method for forming such a sensor. The protective covering with oxygen getter material protects the platinum component against oxygen dissolution therein, thereby reducing sensor drift.

13 Claims, 5 Drawing Sheets

(56) References Cited

U.S. PATENT DOCUMENTS

| | | | | |
|---|---|---|---|---|
| 2001/0004790 A1* | 6/2001 | Gnade | ................... | H01L 28/60 |
| | | | | 29/25.42 |
| 2007/0013014 A1* | 1/2007 | Guo | .................. | C23C 14/5873 |
| | | | | 257/417 |
| 2011/0132449 A1* | 6/2011 | Ramadas | ............... | H01L 51/56 |
| | | | | 136/256 |

FOREIGN PATENT DOCUMENTS

| | | | |
|---|---|---|---|
| CN | 102227809 A | 10/2011 | |
| CN | 104634471 A | 5/2015 | |
| DE | 19858357 A1 | 6/2000 | |
| EP | 0609081 A2 | 8/1994 | |

OTHER PUBLICATIONS

Office Action from corresponding Chinese Application No. 201910521364.7, dated Aug. 10, 2021.

* cited by examiner

SENSOR INCLUDING OXYGEN GETTER METALLIC MATERIAL FOR IMPROVED PROTECTION

TECHNICAL FIELD OF THE INVENTION

The present invention relates to the field of platinum metallisation and more in particular to its protection against oxygen dissolution and to its use in sensors.

BACKGROUND OF THE INVENTION

Platinum is commonly used in sensor structures either as an active component or as a protective layer. When used as a protective layer, it often takes the role of protecting underlying semiconductor layers from corrosive effects of the environment, e.g. exhaust gases, and/or of protecting the sensor against electromagnetic and electrostatic fields which may affect the performance thereof.

Examples of sensors where platinum is used as an active component are temperature sensors and flow sensors where platinum is used to form resistors with a controlled temperature coefficient of resistance. It has been observed that such sensors experience sensor drift, i.e. their response to a same stimulus drift over time.

An example of sensor where platinum is used as a protecting component is a pressure sensor. For instance, a silicon pressure sensor comprising a protective platinum layer is a type of sensor that is commonly used in harsh media conditions. Pressure sensors typically comprise a flexible diaphragm or membrane which exhibits a predictable flexure when pressure is applied thereon. The pressure sensor is electrically responsive to the flexing of the diaphragm or membrane.

US2007013014 discloses such a pressure sensor including a substrate having a first surface and a second surface, wherein the second surface is in communication with the environment. The pressure sensor includes a device layer sensor means located on the substrate for measuring a parameter associated with the environment. The pressure sensor further includes an output contact located on the substrate and in electrical communication with the sensor means. US2007013014 discloses a metallisation layer blocking inward diffusion of undesired elements such as oxygen, nitrogen and carbon dioxide. This metallisation layer includes a layer of tantalum located on the substrate, which serves as an adhesion layer, with a layer of tantalum silicide located on the tantalum layer, and a layer of platinum located on the tantalum silicide layer.

The present inventors have noticed that sensors comprising such a platinum-containing metallisation layer experience sensor drift, i.e. the way the diaphragm or membrane flexes in response to a same pressure changes with time and the pressure reading loses in reliability.

If sensor drift happens during the lifetime of the sensor it is difficult, or in some cases impossible, to compensate for it.

Before the present invention, it was not clear why this drift happened and how to efficiently remedy it.

There is therefore a need in the art for limiting or eliminating sensor drift in sensors comprising a platinum component.

SUMMARY OF THE INVENTION

It is an object of the present invention to provide at least a partial solution to sensor drift in sensors comprising a platinum component, and to other phenomena sharing the same cause.

It is an advantage of embodiments of the present invention that change in the stress level of a platinum component of a sensor can be reduced. For instance, in some embodiments the stress change can be reduced by a factor in excess of 10.

It is an advantage of embodiments of the present invention that sensor drift can be reduced.

It is an advantage of embodiments of the present invention that the disclosed solution is easy to implement.

It is an advantage of embodiments of the present invention that the disclosed solution is inexpensive.

In a first aspect, the present invention relates to a sensor. The sensor comprises a substrate, a platinum component, and a protective covering on the platinum component. The platinum component has a first surface facing toward the substrate and a second surface facing away from the substrate. The present inventors have realized that sensors comprising a platinum component tend to experience sensor drift over time despite the well-known inertness of platinum. In particular, this phenomenon was observed in pressure sensors having a protective platinum layer and in temperature sensors having platinum resistors. This surprising fact lead to investigations on pressure sensors where the inventors realized that a probable cause for this sensor drift is a change in stress in the sensor membrane or diaphragm caused by a change in stress in the overlying platinum protective layer. In further investigations, it has been shown that oxygen dissolution in the platinum layer causes its deformation, which in turn changes the stress between the platinum layer and the layer underneath the platinum. That oxygen could be the source of a stability problem in a platinum component was surprising since platinum is typically selected in devices due in large part to its resistance to oxidation. It was then realized that oxygen dissolution is also responsible for resistor drift when a platinum resistor is used in platinum temperature sensors, platinum heaters, and platinum flow sensors.

In response to the realization that oxygen dissolution in platinum was a problem to be solved, the inventors envisioned providing a protective covering over the platinum component. The role of this protective covering is to act as an oxygen barrier, thereby preventing change in oxygen concentration, and hence in stress, in the platinum component. The change in oxygen concentration is typically a raise in oxygen concentration due to oxygen dissolution but it could also be a decrease in oxygen concentration due to oxygen depletion. The later could for instance occur if the platinum in the sensor was saturated in dissolved oxygen before its use in an oxygen-poor environment such as a motor exhaust.

The protective covering is placed on the platinum component. It comprises one or more layers. At least one of these layers is an oxygen getter material. The protective covering has a lower surface in physical contact with the second surface of the platinum component and it has an upper (typically exposed) surface.

In a second aspect, the present invention relates to a method for forming a sensor, the method comprising:

providing a substrate, providing a platinum component so that a first surface thereof faces toward the substrate and a second surface thereof faces away from the substrate, providing a protective covering on the platinum component, the protective covering comprising:

one or more layers, at least one of which comprising an oxygen getter material, a lower surface in physical contact with the second surface of the platinum component, and
an upper (typically exposed) surface.

Since the present invention rests on the realisation that oxygen dissolution in platinum can occur and pose a problem, a third aspect of the present invention relates to the use of a metallic material for protecting platinum against oxygen dissolution therein.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIGS. 2-4c show steps in the formation of a sensor according to an embodiment of the present invention.

Figure 1:
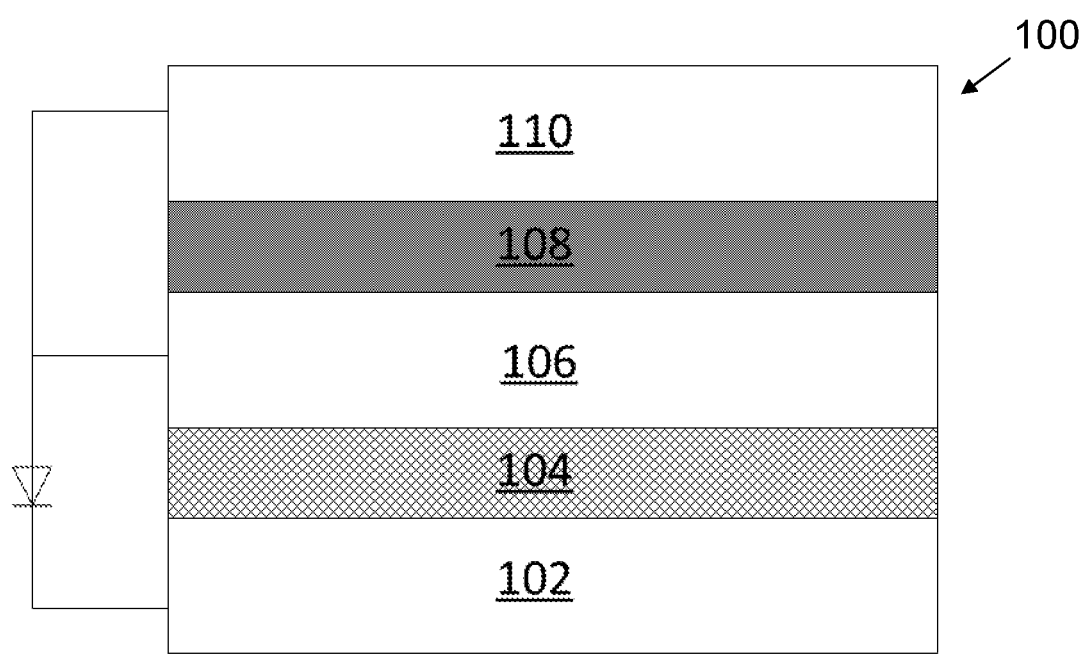
FIG. 1 is a schematic representation of a sensor according to an embodiment of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

In a first aspect, the present invention relates to a sensor comprising:
A substrate,
A platinum component having a first surface facing toward the substrate and a second surface facing away from the substrate,
A protective covering on the platinum component, the protective covering comprising:
one or more layers, at least one of which comprising an oxygen getter material,
a lower surface in physical contact with the second surface of the platinum component, and
an upper surface.

The sensor is a device for receiving and responding to a stimulus. The stimulus may for instance be a pressure, an acceleration, a temperature, a flow, or the like. The response is typically a measurement of the intensity of the stimulus.

The substrate can be any type of substrate. Depending on the type of sensor, the substrate can be made of a dielectric material, a semiconductor material or a conductive material.

In embodiments, the substrate may be a conductive substrate such as, for instance, a conductively-doped silicon substrate. Such a substrate is advantageous when the platinum element is used as a shield against electromagnetic and electrostatic fields. Indeed, a conductive substrate may be coupled to the platinum element to form a faraday cage.

Exemplary materials for a conductive substrate include, but are not limited to metals, conductive polymers, and doped semiconductor materials (e.g. single crystal, polycrystalline, amorphous, or composite semiconductors) such as p-type or n-type doped group IV (e.g. Si, Ge, SiGe, or SiC) or group III-V semiconductor materials (e.g. GaAs, InP, or InAs), or the like.

Si is preferred as it provides good structural stability, controlled conductivity, and the ability to be chemically or mechanically milled to a precise thickness which is for instance useful to form a diaphragm in a pressure sensor.

The conductive substrate of certain embodiments may comprise p-type or n-type doped silicon (typically n-doped silicon), for instance with a resistivity in a range between 1 ohm-cm and 35 ohms-cm. This range of resistivity is advantageous when the substrate is coupled to the platinum element to provide electromagnetic and electrostatic shielding.

The substrate may have any thickness. For instance, it may have a thickness of form 100 μm to 2000 μm.

In embodiments where the substrate is conductive, it may be electrically coupled to the platinum element. For instance, if the platinum component is a platinum protective layer, its coupling to the conductive substrate may form a faraday cage protecting the sensor against electromagnetic and electrostatic fields.

In embodiments, the substrate may comprise a flexible diaphragm. This is typical of pressure sensors where the flexible diaphragm flexes in response to pressure and where this flexing is detected by the sensor.

The flexible diaphragm may be a thinned region of the substrate. The thinned region of the substrate may be obtained by cutting out a region of the substrate. The cut-out region defines a flexible diaphragm in the remaining portion of the substrate.

In embodiments, a sheet that exhibits a predictable flexure for a given pressure may be attached over the cut-out region of the substrate. In certain such embodiments, the sheet may serve as part of the diaphragm. Rather than etching the diaphragm from the substrate, in certain embodiments, a hole is formed in the conductive substrate and the sheet is bonded over the hole to the conductive substrate. In certain such embodiments, the sheet serves as the diaphragm. For example, the sheet may comprise a flexible material, including but not limited to, metals, metal alloys, polymeric materials, semiconductor materials, ceramics, glasses, or other flexible materials. In an embodiment illustrated in FIGS. 2 and 3, the sheet is a further semiconductor substrate which thickness has been reduced.

The diaphragm flexes when pressure or force is applied to the sensor. The physical parameters of the diaphragm (e.g. materials, thickness, stress) affect how much the diaphragm flexes when pressure is applied, which in turn affects the output range of the sensor. Generally, the sensitivity of the sensor decreases as the thickness of the diaphragm increases. In some embodiments, the thickness of the diaphragm is in a range between 1 microns and 300 microns.

In embodiments, the substrate may be electrically connected to a supply voltage, e.g. to a positive supply voltage.

In embodiments, the substrate may be electrically connected via a diode, via electrically conductive glue, or via resistive contacts.

The platinum component may for instance be an active component or a protective layer.

An example where the platinum component is used as an active component is when the sensor comprises a platinum resistor. This is for instance the case in a temperature sensor or a flow sensor. An example where the platinum component is used as a protective layer is when it takes the role of protecting underlying semiconductor layers from corrosive effects of the environment, e.g. exhaust gases, and/or of protecting the sensor against electromagnetic and electrostatic fields which may affect the performance thereof. Pressure sensors may comprise a platinum layer for one or both of these purposes.

The thickness of the platinum component may be for instance from 10 nm to 1000 nm.

The protective covering is on the platinum component. It is typically in contact with the platinum component. It comprises one or more layers. At least one of these layers comprise an oxygen getter material. Preferably, at least one of the one or more layers consists of an oxygen getter material.

As used herein and unless provided otherwise, an oxygen getter material is a material which absorbs or reacts with oxygen. Typically, useful oxygen getter materials have an oxide formation enthalpy less than minus 250 kJ/mole per involved oxygen atom. This permits oxygen released by $CO_2$ reduction to be gettered at temperatures up to 250° C.

Preferably, the oxygen getter material is a metallic material.

More preferably, the oxygen getter material comprises at least 50 at %, at least 75 at %, at least 90 at %, at least 95%, or consists of one or more elements selected from alkali metals (e.g., Li, Na, and K), alkaline-earth metals (e.g., Mg and Ca), zinc, refractory metals (e.g., Ti, Zr, Hf, Ta, V, and Nb), rare earth metals (e.g., La, Ce, Pr, Nd, Sm, Eu, Gd, Tb, Dy, Yb, Sc, and Y), actinides (e.g. Ac) and mixtures and alloys thereof.

Yet more preferably, the oxygen getter material is a metallic material comprising at least 50 at %, at least 75 at %, at least 90 at %, at least 95%, or consisting of one or more elements selected from refractory metals, rare earth metals and actinides. These are preferred to alkali metals because of their higher fusion point (higher than 750° C.), limiting their diffusion in Pt.

Yet more preferably, the oxygen getter material is a metallic material comprising at least 50 at %, at least 75 at %, at least 90 at %, at least 95%, or consisting of one or more elements selected from Ta, Nb, V, Hf, Zr, Ti, Y, and Sc. These are preferred because of their high fusion point (at least 1500° C.), limiting their diffusion in Pt.

These elements of groups III, IV and V of the periodic table are particularly advantageous due to their metallic character, their ductility and their relatively low diffusion coefficient in Pt. They can act as efficient oxygen barrier even at low thickness. This permits to impact sensor sensitivity as less as possible while nevertheless providing oxygen barrier properties. They are also ductile, making them resistant to cracking, which is preferably avoided since it would represent an oxygen entry port. They also display good adhesion on platinum and they do not cause sensor drift by diffusing too easily in platinum.

Yet more preferably, the oxygen getter material is a metallic material comprising at least 50 at %, at least 75 at %, at least 90 at %, at least 95%, or consisting of one or more elements selected from Ta, Nb, V, Hf, Ti, and Zr. These are preferred because of their very high fusion point (at least 1650° C.)

In embodiment, the layer comprising an oxygen getter material may have a melting point of at least 1500° C., preferably at least 2000° C., preferably at least 2500° C. This is advantageous as it limits the diffusion of the getter material in the Pt.

In embodiment, the oxygen getter material may comprise at least 50 at %, at least 75 at %, at least 90 at %, at least 95%, or consists of one or more elements having a melting point of at least 1500° C., preferably at least 2000° C., preferably at least 2500° C. This is advantageous as it limits the diffusion of the getter material in the Pt.

In embodiment, the oxygen getter material may comprise at least 50 at %, at least 75 at %, at least 90 at %, at least 95%, or consists of one or more elements having an atomic metallic radius of at least 135 μm, preferably at least 140 μm, more preferably at least 145 μm. This is advantageous as it limits the diffusion of the getter material in the Pt.

If the protective covering is made of a single layer, the layer comprises an oxygen getter material.

If it is made of two or more layers, it has a lower surface in physical contact with the second surface of the platinum component, and an upper surface. The upper surface is typically an exposed surface, i.e. a surface susceptible to be in contact with oxygen. It belongs to an upper layer. In embodiments, the lower surface can belong to a dielectric layer such as a $SiO_2$, a $Al_2O_3$ or a SiN layer. It these embodiments, the oxygen getter layer may be on that dielectric layer.

In preferred embodiments, the lower surface may belong to the oxygen getter layer.

In any embodiments, the one or more elements may form at least 50 at. %, preferably at least 75 at. %, more preferably at least 90 at. %, and most preferably at least 95 at. % of the layer comprising the lower surface. For instance, the layer to which the lower surface belong may consist of the one or more elements.

Preferably, the layer comprising the lower surface comprises Ta. In embodiments, Ta may form at least 50 at. %, more preferably at least 75 at. %, yet more preferably at least 90 at. %, yet more preferably at least 95 at. % of the layer comprising the lower surface. Most preferably, it consists of Ta. Ta and its alloys, in addition to their particularly good oxygen barrier and good oxygen gettering properties, low diffusion in platinum, good adhesion properties, and good crack resistance, have the additional advantage of forming a very dense top oxide layer in presence of oxygen. This dense oxide layer limit further oxidation of the Ta layer and further prevent oxygen diffusion into the metal stack.

In embodiments, the upper surface may belong to a layer consisting of an oxide of the oxygen getter material. In a preferred embodiment, the protective covering may consist of two layers, wherein the layer comprising the lower surface may consist of Ta and the upper surface may belong to a layer consisting of $Ta_2O_5$. This can typically be obtained by providing a Ta layer comprising the lower surface and by exposing the top surface of that Ta layer to a source of oxygen, thereby oxidizing it.

In embodiments where the protective covering has more than one layer, the upper (exposed) surface may belongs to a layer consisting of platinum.

In embodiments, the protective covering may have a thickness of from 1 to 100 nm, preferably from 5 to 100 nm, such as from 5 to 25 nm. In embodiments, the layer comprising a getter material may have a thickness of from 1 nm to 100 nm, preferably from 5 to 100 nm, such as from 5 to 25 nm. The layer consisting of an oxide of the oxygen getter material may for instance have a thickness of from 1 to 5 nm, such as from 1 to 3 nm. This layer is however susceptible to grow over time while consuming the layer comprising the getter material. The second platinum layer may for instance have a thickness of from 1 to 20 nm. Lower Pt thicknesses are preferred because this second Pt layer is exposed and not protected by the protective covering, therefore contributing to sensor drift.

In embodiments, the sensor may further comprise an adhesion layer such as a Ta layer in contact with the first surface of the platinum component. Such a Ta layer is useful to promote adhesion between the platinum component and the underlying layer.

The Ta layer is preferably chosen sufficiently thin to allow Pt to diffuse in to the silicon in order to decrease the bandgap in the silicon (provide additional doping).

The Ta layer is preferably chosen sufficiently thick to prevent fast Pt Si mixing which is very exothermic and could create lack of process repeatability.

Examples of alternatives to Ta for the adhesion layer are $CuAlO_3$, Cr, Zr, NiV, Ti, TiW and Hf. The adhesion layer can have a variety of thicknesses. For instance, it can be between 10 nm and 1000 nm.

In embodiments, the sensor may comprise one or more electronic components over the substrate, wherein the platinum component is a platinum (protective) layer over at least one of the electronic components, the first surface facing toward the at least one of the electronic components and the second surface facing away from the at least one of the electronic components. The layer comprising these one or more electronic components is typically referred to as the device layer. In some of these embodiments, the one or more electronic components may form a circuit electrically responsive to an external stimulus. For instance, the substrate may comprise a flexible diaphragm and the external stimulus may be a pressure. In such embodiments, the circuit may be electrically responsive to flexing in the diaphragm. As an example, in the case of a pressure sensor, the one or more electronic components can be piezoresistive components formed by doping a semiconductor device layer. The piezoresistive components may be connected together in a Wheatstone bridge configuration. The deflection of the diaphragm is then measured through a change in resistance of the piezoresistive elements in a well-known manner.

In embodiments, the one or more electrical components and the substrate may be separated by an electrically insulating region and/or the one or more electrical components and the platinum layer may be separated by an electrically insulating region.

Each electrically insulating region may independently be provided under the form of a dielectric layer, a depletion layer, or a combination of both. The dielectric layer may for instance be a silicon oxide layer, a silicon nitride layer, or a combination of both. The insulating region separating the substrate from the one or more electrical components may for instance be a buried silicon oxide layer. When the insulating region separating the substrate from the one or more electrical components is a dielectric layer, its thickness may for instance be from 0.1 µm to 20 µm. The insulating region separating the one or more electrical components from the platinum layer may be a silicon oxide layer on the one or more electrical components and a silicon nitride layer on the silicon oxide layer.

The depletion layer may result from a p-n junction or from a Schottky metal/semiconductor interface. For instance, if the substrate is of an n-type and the device layer comprising the one or more electrical components is of a p-type, a depletion region may form which isolate the substrate from the one or more electrical components. As another example, if the device layer has a Ta adhesion layer thereon, this Ta layer may induce a depletion layer between the Ta adhesion layer and the device layer.

If the one or more electrical components and the platinum layer are separated by a dielectric layer, the potential of the top metallisation layer, comprising the platinum layer, an optional underlying Ta adhesion layer and an overlying protective covering comprising a layer made of a metallic material, does not matter but preferably remains fixed with respect of the potential of the device layer, i.e. it does not change during the lifetime of the device.

If the one or more electrical components and the substrate are separated by a dielectric layer, e.g. when an SOI has been used in the fabrication of the sensor, the potential of the substrate does not matter but preferably remains fixed with respect of the potential of the device layer, i.e. it does not change during the lifetime of the device.

In embodiments, the upper surface of the protective covering can be a second platinum layer. In embodiments, the sensor may comprise a Ta adhesion layer in contact with the first surface of the platinum layer, the platinum layer, a Ta layer in contact with the second surface of the platinum layer, and a second platinum layer in contact with the Ta layer. In embodiments, the second platinum layer may have a thickness of at most 10 nm but a larger thickness or no second platinum layer are also possible. A second platinum layer has is advantageous for bonding purposes as it protects the metallic layer of the protective covering against oxidation in high temperature processes performed in air. However, a second platinum layer can be a source of sensor drift.

In embodiments, additional layers can be put on top of the metallization layer. For instance, silicon nitride or aluminium oxide can be put on top of the metallization layer.

In embodiments of the first aspect, the present invention may relate to a pressure sensor, a temperature sensor or a flow sensor.

Alternatives to the first aspect relate to electronic devices or electrical devices comprising:
A substrate,
A platinum component having a first surface facing toward the substrate and a second surface facing away from the substrate,
A protective covering over the platinum component, the protective covering comprising:
one or more layers, at least one of which comprising an oxygen getter material,
a lower surface in physical contact with the second surface of the platinum component, and
an upper surface.

Any feature of this alternative may be as correspondingly described in the first aspect or its other alternatives.

In a second aspect, the present invention relates to a method for forming a sensor, the method comprising:
providing a substrate,
providing a platinum component so that a first surface thereof faces toward the substrate and a second surface thereof faces away from the substrate,
providing a protective covering over the platinum component, the protective covering comprising:
one or more layers, at least one of which comprising an oxygen getter material,
a lower surface in physical contact with the second surface of the platinum component, and
an upper surface.

The step of providing a substrate can, in the example of the fabrication of a pressure sensor, comprise a step of forming a cavity in a substrate such as a Si wafer. This cavity can be formed by dry or wet etching. An example of dry etching that can be used is deep reactive ion etching. An example of wet etching is a KOH etching. The etching of the cavity has for consequence the formation of a thinned region below the etched part of the substrate. This thinned region can be used as a flexible diaphragm as described in the first aspect. Alternatively, providing the substrate may comprise, after forming a cavity in a first substrate, bonding a second substrate (e.g. a second Si wafer or a SOI wafer) on the surface of the first surface where the cavities are etched. Bonding can be performed by fusion bonding. This second substrate can then be thinned to form the diaphragm. If the second substrate was a silicon wafer, thinning the second substrate can be done by grinding or by etching it back. If the second substrate was a SOI wafer, different chemistries can be used to etch back the Si and the $SiO_2$. The thinned part of the second substrate which is overlapping the cavity can then serve as a diaphragm.

Providing the platinum component can lead to the formation of an active platinum component such as a platinum resistor. In that case the platinum component can be formed over the substrate. Providing the platinum component can lead to the formation of a protective platinum layer. In that case the platinum component can be formed on a device layer needing protection. Some embodiments of the second aspect of the present invention therefore involve the formation of a device layer. As an example, in the case of a pressure sensor, a semiconductor device layer may be provided above the substrate. For this purpose, for instance, a semiconductor layer may be provided above the substrate and one or more electronic components may be formed on the semiconductor layer. For instance, one or more piezoresistive components may be formed by doping the semiconductor device layer. The piezoresistive components may be connected together in a Wheatstone bridge configuration. One way to form the piezoresistive components by doping is by forming a relatively deep low dose p-implant region in an n-type semiconductor device layer. Then, to create a conductive line toward the piezoresistive component and a connection to metal, a shallower higher dose p-implant region can be formed inside the lower dose region.

The step of providing the platinum component can for instance be performed by sputtering through a lift-off mask. Also, the protective covering and the optional adhesion layer may be provided by sputtering. As an example, a Ta layer may be first sputtered on an underlying layer (e.g on the substrate or on the device layer if present), a Pt layer may be then sputtered on the Ta layer, a Ta layer may be sputtered on the Pt layer, and finally the top surface of the Ta layer may be placed in contact with oxygen. As a result of the presence of oxygen, the top surface of Ta oxidizes in a very dense top oxide layer limiting further oxygen diffusion down the Ta layer and the platinum.

The adhesion layer and the protective covering can of course also be provided by other means such as screen printing or sol-gel (e.g. sintered in an oxygen-free atmosphere).

Any feature of the second aspect may be as correspondingly described in the first aspect and its alternatives.

In a third aspect, the present invention relates to the use of a metallic material for protecting platinum against oxygen dissolution therein.

Indeed, although layers comprising an oxygen getter are especially advantageous for this purpose, some degree of efficacy against oxygen dissolution in platinum can be obtained with any metallic layer; and to the best of our knowledge, no metallic layer has ever been used for that purpose yet. In a preferred embodiment, the third aspect may relate to the use of an oxygen getter for protecting platinum against oxygen dissolution therein.

Any feature of the third aspect may be as correspondingly described in the first aspect and its alternatives.

FIG. 1 is a block diagram of a shielded sensor 100 according to an embodiment of the invention described herein.

The sensor 100 comprises:
 a conductive substrate 102, typically n-doped silicon
 a bottom insulating region 104, comprising a depletion layer on a p-n junction or a dielectric layer such as a buried silicon oxide layer
 a device layer 106, typically comprising p-doped silicon
 a top insulating region 108, for instance comprising a silicon oxide on the device layer and a silicon nitride layer on the silicon oxide,
 a metallisation layer 110 comprising a Pt layer having a second surface facing away from the substrate and a protective covering comprising Ta (i.e. an oxygen getter material) in contact with the second surface; for instance, the metallisation layer 110 may comprise a Ta adhesion layer on the top insulation region, a main conductance Pt layer, and a protective covering formed of a Ta layer in contact with the Pt layer and an exposed $Ta_2O_5$ layer formed from oxidation of the Ta layer.

Electrical connection of the substrate to a positive voltage may be via a diode (which would be connected to the top of the substrate) but it could also be via a conductive glue (not shown, which would be on the back of the substrate) or via a resistive contact.

Figure 2:
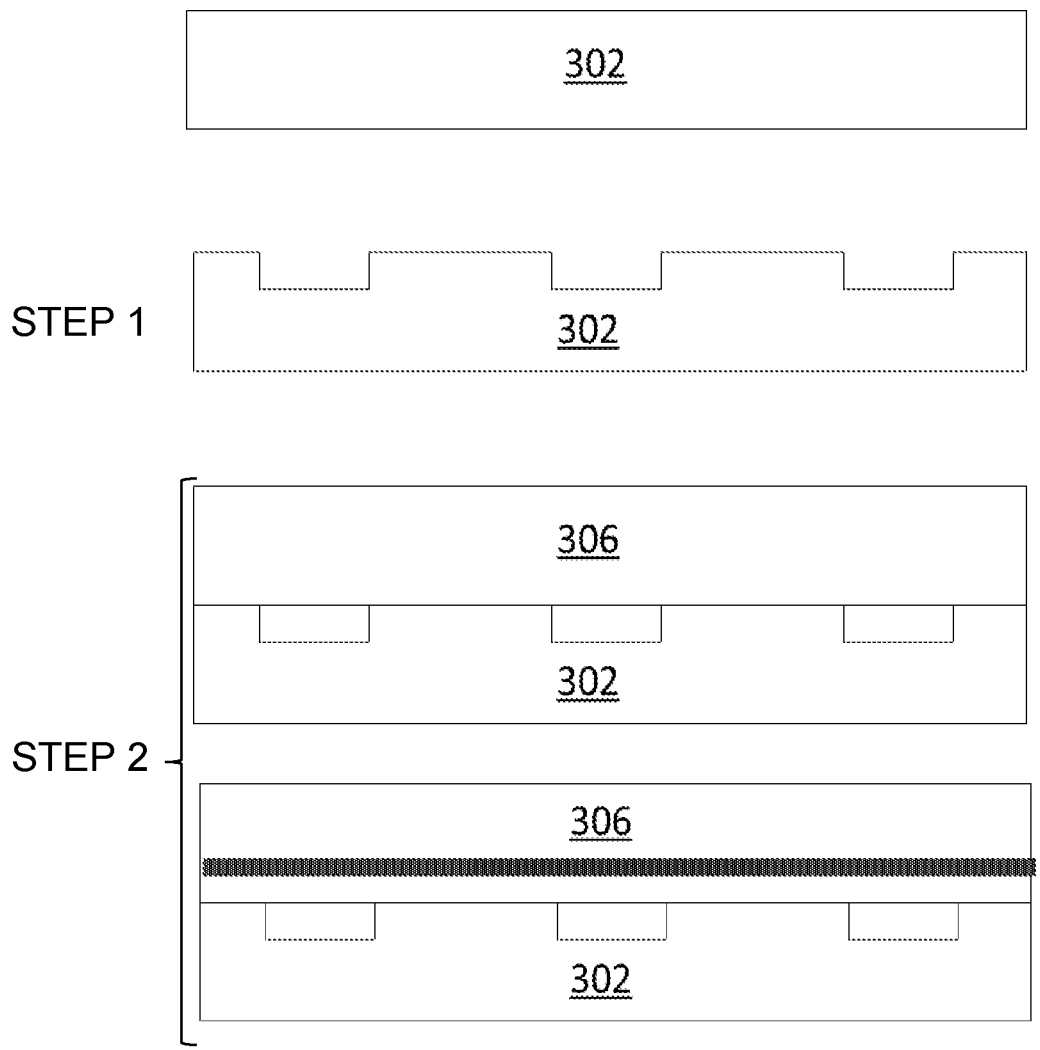
Figure 3:
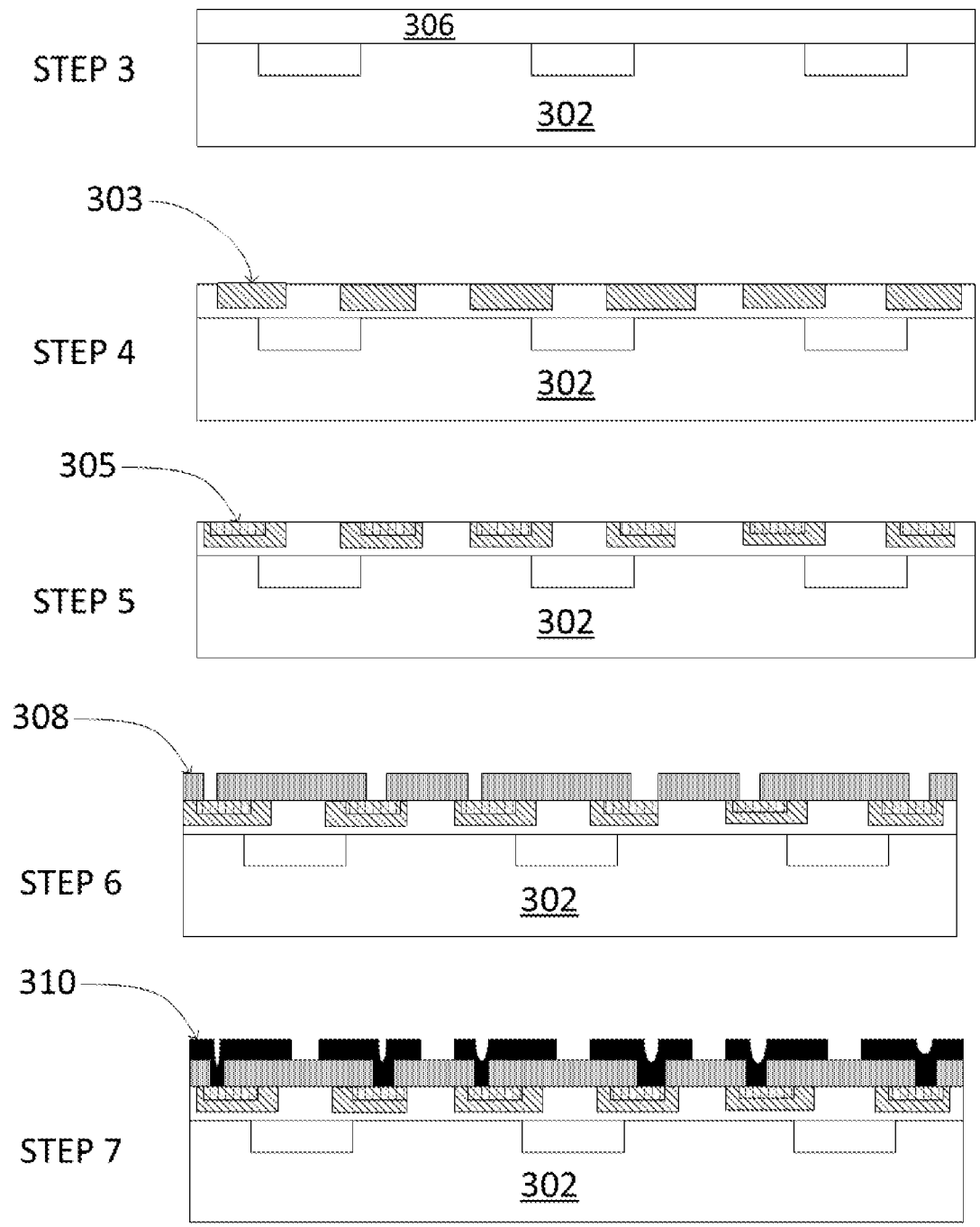
Figure 4:
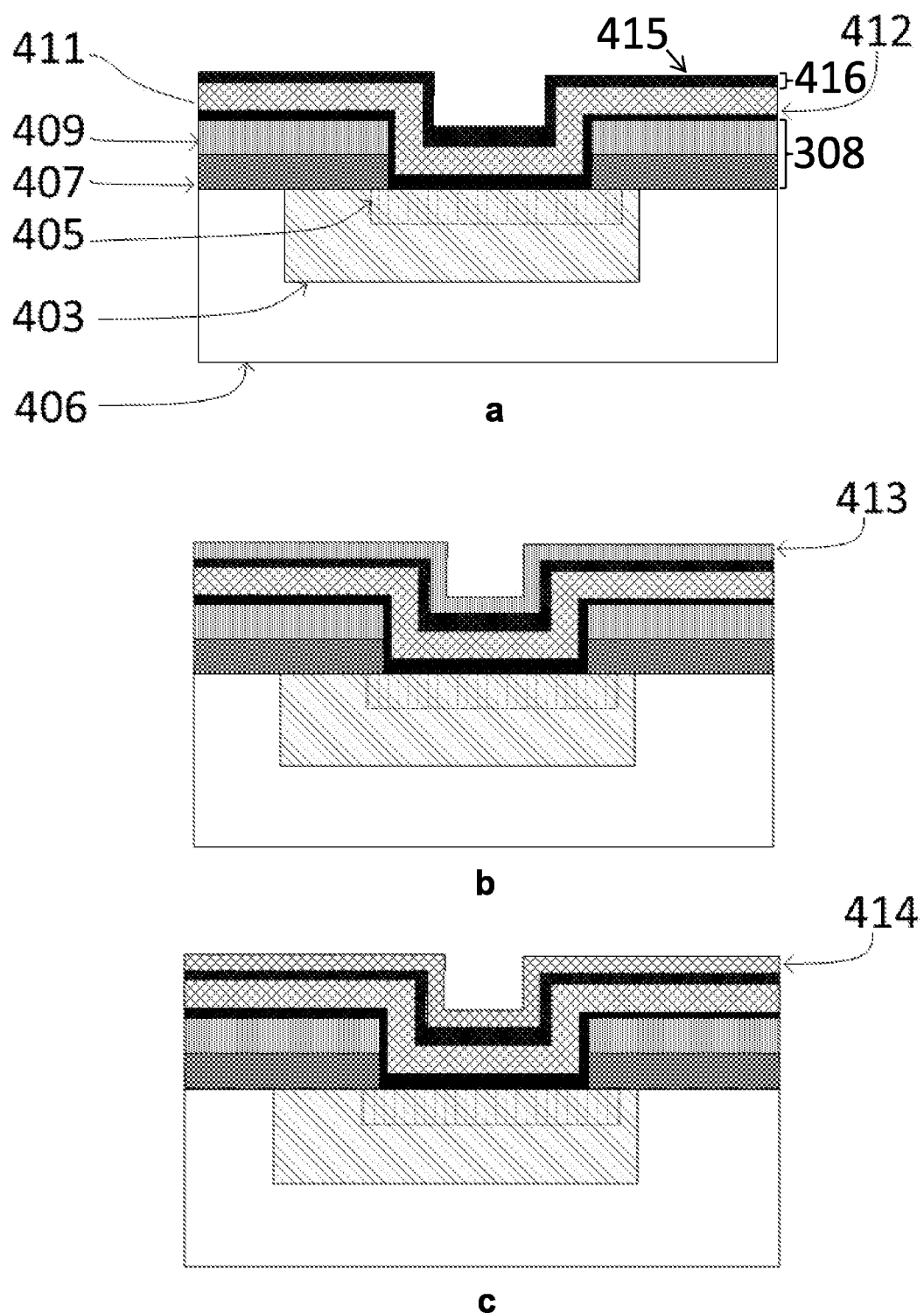

FIGS. 2, 3 and 4 show the processing steps for producing a pressure sensor using a shield structure according to an embodiment of the present invention.

In step 1, cavities are formed in the base wafer 302. For instance, DRIE or KOH etch can be used.

In Step 2 another wafer 306, which can be either a semiconductor wafer (top) or a SOI wafer (bottom) is bonded on the face of the wafer 302 where the cavities are present. Fusion bonding may be used for this step.

In the Step 3, the second wafer 306 is thinned to certain thickness. Grinding or etching back may be used for thinning the second wafer. Portions of the second wafer overlapping with a cavity will function as a diaphragm in the pressure sensor.

In Steps 4 and 5, piezo resistors are formed by performing a deep, low dose p-implant region 303 in the second wafer 306. Next, interconnects are formed by a shallow, high dose p-implant region 305 inside the low dose region 303 in Step 5.

Then in Step 6, a passivation dielectric layer 308 is patterned on top of the second wafer 306.

Finally, in Step 7 a metallisation stack 310 is deposited on top of the passivation layer. FIGS. 4*a*-4*c* show the metallisation stack according to an embodiment of the invention in more details.

In FIGS. 4*a*-4*c*, the bottom layers are the same as in FIG. 3 Step 7, only the base wafer 302 is not shown. 406 is the second wafer, e.g. a n-silicon substrate. 403 and 405 are low dose p-implant region and high dose p-implant region, respectively. The dielectric layer 308 of FIG. 4 is divided into silicon oxide layer 407 and silicon nitride layer 409. On top of the structure in FIG. 4 is the metallisation stack layer, which is divided here into at least three layers, two Ta layers 412 and 415 and a Platinum layer 411 in between the Ta layers induces a depletion layer between the bottom Ta layer and the doped second wafer (acting as a device layer). Protective covering 416 comprises the top Ta (i.e. an oxygen getter material) layer 415.

It is possible to add a second top silicon nitride layer 413. This is shown in FIG. 4*b*. This provides an additional protection layer while the layer of metallic material of the protective covering makes the system robust against the propagation of cracks that could originate in the second top silicon nitride layer.

FIG. 4*c* shows another optional layer on top of the Tantalum layer. The layer 414 is a tiny platinum top metal in order to protect Ta against high temperature processes in normal ambient atmospheres. In absence of this top platinum layer, bonding on the Ta layer might become difficult or impossible once Ta is oxidized.

Figure 5:
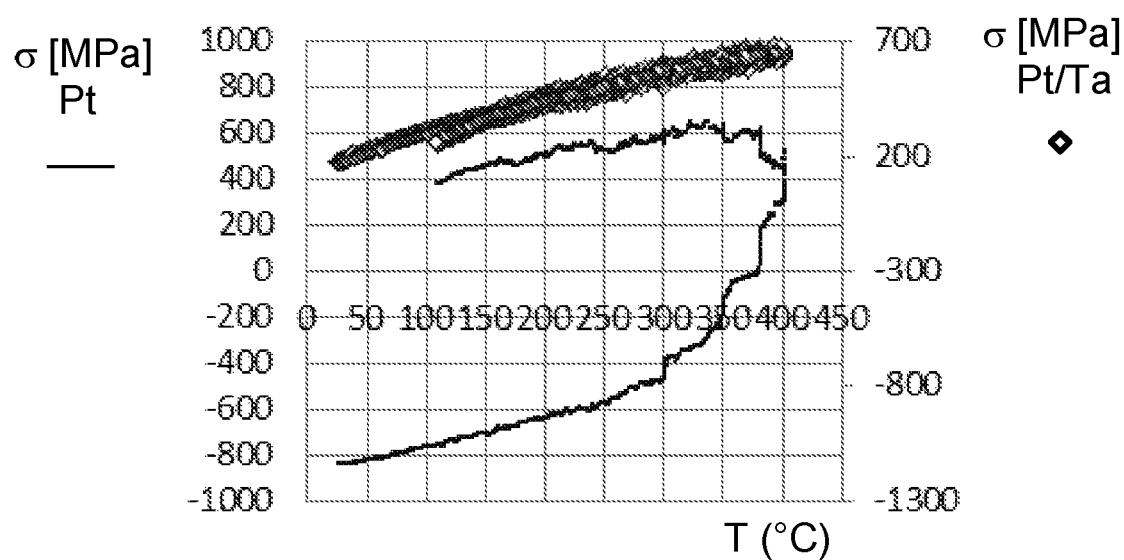
FIG. 5 is a graph of the strain versus the temperature in an unprotected Pt layer according to the prior art and in a protected Pt layer according to an embodiment of the present invention.

FIG. 5 shows the variation of strain in two Pt layers during one cycle of temperature increase from 110° C. to 400° C. and temperature decrease from 400° C. to room temperature in air. The continuous line shows this variation for a Pt layer on a Si substrate with no protective covering on the Pt layer. The diamonds show this variation for a Pt layer on a Si substrate with a protective Ta covering on the Pt layer. The strain for both Pt layers start with a positive value (tensile) at 110° C. of about 390 MPa for the non-protected Pt layer and of around 600 MPa for the protected Pt layer. For the nonprotected Pt layer (solid line), it can be seen that after cycling the temperature one time in air, the strain in the Pt layer has changed drastically and takes a value of around −730 MPa when the Pt layer comes back to 110° C. after the temperature increase to 400° C. This represents a variation of −1120 MPa. For the protected Pt layer (diamonds) according to the present invention, it can be seen that after cycling the temperature one time in air, the strain in the Pt layer has changed very little and takes a value of around 560 MPa at 110° C. before cycling and around 640 MPa at 110° C. after cycling. This represents a variation of +80 MPa. This represents an improvement by a factor 14.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A sensor comprising:
a substrate,
a platinum component having a first surface facing toward the substrate and a second surface facing away from the substrate,
a protective covering on the platinum component, the protective covering comprising:
one or more layers, at least one of which comprising an oxygen getter material,
a lower surface in physical contact with the second surface of the platinum component, and
an upper surface.

2. The sensor according to claim 1, wherein the lower surface belongs to the layer comprising an oxygen getter material.

3. The sensor according to claim 1, wherein the oxygen getter material is a metallic material comprising one or more elements selected from Ta, Nb, V, Hf, Zr, Ti, Y, and Sc.

4. The sensor according to claim 3, wherein the one or more elements form at least 95 at. % of the layer comprising the oxygen getter material.

5. The sensor according to claim 4, wherein the layer comprising the oxygen getter material consists of Ta.

6. The sensor according to claim 3, wherein the upper surface belongs to a layer consisting of an oxide of the oxygen getter material.

7. The sensor according to claim 3, wherein the protective covering has more than one layer and the upper surface belongs to a layer consisting of platinum.

8. The sensor according to claim 3, wherein the layer comprising an oxygen getter has a thickness of from 1 to 20 nm.

9. The sensor according to claim 3, wherein the platinum component is a resistor.

10. The sensor according to claim 3, comprising one or more electronic components over the substrate,
wherein the platinum component is a platinum layer over at least one of the electronic components, the first surface facing toward the at least one of the electronic components and the second surface facing away from the at least one of the electronic components.

11. The sensor according to claim 10, wherein the one or more electronic components form a circuit electrically responsive to an external stimulus.

12. The sensor according to claim 11, wherein the substrate comprises a flexible diaphragm and wherein the external stimulus is a pressure.

13. The sensor according to claim 10, wherein the one or more electrical components and the substrate are separated by an electrically insulating region and/or
wherein the one or more electrical components and the platinum layer are separated by an electrically insulating region,
wherein each electrically insulating region is selected from a depletion region, a dielectric region and a combination of both.

* * * * *